US012763773B2

(12) United States Patent
Børli et al.

(10) Patent No.: US 12,763,773 B2
(45) Date of Patent: Oct. 13, 2026

(54) AGING RESILIENT LEVEL SHIFTER

(71) Applicant: Silicon Laboratories Inc., Austin, TX (US)

(72) Inventors: Håkon Børli, Bekkestua (NO); Pio Balmelli, Arogno (CH)

(73) Assignee: Silicon Laboratories Inc., Austin, TX (US)

( * ) Notice: Subject to any disclaimer, the term of this patent is extended or adjusted under 35 U.S.C. 154(b) by 49 days.

(21) Appl. No.: 18/442,632

(22) Filed: Feb. 15, 2024

(65) Prior Publication Data

US 2025/0266835 A1 Aug. 21, 2025

(51) Int. Cl.
*H03K 19/0185* (2006.01)
*H03K 3/356* (2006.01)

(52) U.S. Cl.
CPC ............... *H03K 19/018521* (2013.01); *H03K 3/356113* (2013.01); *H03K 3/356182* (2013.01)

(58) Field of Classification Search
CPC ....... H03K 19/0175; H03K 19/017509; H03K 19/0185; H03K 19/018514; H03K 19/018521; H03K 3/356113; H03K 3/356182
See application file for complete search history.

(56) References Cited

U.S. PATENT DOCUMENTS

| | | | | |
|---|---|---|---|---|
| 6,201,429 | B1 | 3/2001 | Rosenthal | |
| 7,180,329 | B1 | 2/2007 | Sia et al. | |
| 7,199,617 | B1 | 4/2007 | Schrom et al. | |
| 7,710,182 | B2 * | 5/2010 | Yu | H03K 3/012 327/333 |
| 8,446,173 | B1 | 5/2013 | Faucher et al. | |
| 8,610,462 | B1 | 12/2013 | Wang et al. | |
| 8,847,661 | B2 | 9/2014 | Choung | |
| 9,076,529 | B2 * | 7/2015 | Ogawa | G11C 16/30 |
| 9,225,330 | B2 | 12/2015 | Koudate | |
| 9,331,679 | B1 | 5/2016 | Jain et al. | |
| 10,063,188 | B2 | 8/2018 | Srinivas | |
| 10,707,871 | B1 | 7/2020 | Al-Shyoukh | |

(Continued)

OTHER PUBLICATIONS

Abdelmoaty, A., et al., "A High-Voltage Level Shifter with Sub-Nano-Second Propagation Delay for Switching Power Converts," IEEE Applied Power Electronics Conference and Exposition (APEC), Mar. 20-24, 2016, pp. 2437-2440.

*Primary Examiner* — Long Nguyen
(74) *Attorney, Agent, or Firm* — Zagorin Cave LLP

(57) ABSTRACT

An aging resilient level shifter has an increased lifetime as compared to a conventional level shifter. In at least one embodiment, a method for level-shifting a received signal from a first voltage domain to a second voltage domain includes controlling a cross-coupled pair of transistors according to an input signal and a complementary input signal to generate a signal on a pair of complementary nodes. The cross-coupled pair of transistors has a first doping type and the controlling uses a pair of transistors having a second doping type. The second doping type is complementary to the first doping type. The method includes isolating the pair of transistors from the pair of complementary nodes using a pair of isolation transistors and a pair of cascode transistors. The pair of cascode transistors is coupled between the pair of transistors and the pair of complementary nodes.

19 Claims, 2 Drawing Sheets

(56) References Cited

U.S. PATENT DOCUMENTS

| | | | | |
|---|---|---|---|---|
| 11,463,084 | B1 | 10/2022 | Ganesan et al. | |
| 2005/0285658 | A1 | 12/2005 | Schulmeyer et al. | |
| 2008/0042722 | A1 | 2/2008 | Dombusch | |
| 2010/0026366 | A1* | 2/2010 | Wang | H03K 3/35613<br>327/333 |
| 2017/0237438 | A1 | 8/2017 | Terletzki | |

* cited by examiner

AGING RESILIENT LEVEL SHIFTER

BACKGROUND

Field of the Invention

The invention relates to integrated circuits and more particularly to circuits for converting signals from one voltage domain to another voltage domain.

Description of the Related Art

In general, a level shifter is a circuit that translates signals from one voltage domain to another voltage domain to provide interoperability between integrated circuits having different voltage requirements. For example, a conventional level shifter converts signals generated in a low power domain (e.g., by a processor operating with a power supply voltage of 1 V) to signals for use by circuits in a high power domain (e.g., analog input/output circuits operating at 3.6 V). Reuse of level shifter circuits originally designed for a target manufacturing process (e.g., a 40 nm process) in a later-developed manufacturing process (e.g., 22 nm process) may have acceptable performance over some operating conditions. However, hot carrier injection degrades the performance of a conventional level shifter circuit under extreme operating conditions, e.g., high supply voltage (e.g., 3.8 V), low temperature (e.g., −40 C), and high signaling frequency (greater than 1 MHz). Simulations indicate that such degradation causes performance of the level shifting circuit to fall out of a target range in less than one year. Accordingly, improved techniques for level shifting are desired.

SUMMARY OF EMBODIMENTS OF THE INVENTION

In at least one embodiment, a method for level-shifting a received signal from a first voltage domain to a second voltage domain includes controlling a cross-coupled pair of transistors according to an input signal and a complementary input signal to generate a signal on a pair of complementary nodes. The cross-coupled pair of transistors has a first doping type and the controlling uses a pair of transistors having a second doping type. The second doping type is complementary to the first doping type. The method includes isolating the pair of transistors from the pair of complementary nodes using a pair of isolation transistors and a pair of cascode transistors. The pair of cascode transistors is coupled between the pair of transistors and the pair of complementary nodes. In an embodiment, the pair of transistors comprises low-voltage transistors and the cross-coupled pair of transistors, the pair of isolation transistors, and the pair of cascode transistors comprise high-voltage transistors. In an embodiment, the pair of transistors is in the first voltage domain and the cross-coupled pair of transistors, the pair of cascode transistors, and the pair of isolation transistors are in the second voltage domain. In an embodiment, the first voltage domain has an input power supply voltage level above an input ground and the second voltage domain has an output power supply voltage level above an output ground. In an embodiment, the output power supply voltage level is greater than the input power supply voltage level.

In at least one embodiment, a level shifter includes a cross-coupled pair of transistors coupled between a first power supply node and a first pair of nodes. The cross-coupled pair of transistors has a first doping type. The level shifter includes a pair of isolation transistors coupled between the first pair of nodes and a second pair of nodes. The pair of isolation transistors has a second doping type. The second doping type is complementary to the first doping type. The level shifter includes a pair of cascode transistors coupled between the second pair of nodes and a third pair of nodes. The pair of cascode transistors has the second doping type. The level shifter includes a pair of transistors coupled between the third pair of nodes and a second power supply node. The pair of transistors has the second doping type. The pair of transistors is configured to receive an input signal and a complementary input signal. In an embodiment, the level shifter includes an input circuit coupled between the second power supply node and a third power supply node and is configured to generate the complementary input signal based on the input signal. In an embodiment, the level shifter includes an output circuit coupled between the first power supply node and a fourth power supply node and is configured to generate an output signal on an output node based on a signal on the first pair of nodes. In an embodiment, the first power supply node is configured to receive an output power supply voltage level above an output ground and the third power supply node is configured to receive an input power supply voltage level above an input ground. The output power supply voltage level is greater than the input power supply voltage level. The second power supply node is coupled to an input ground. In an embodiment, the pair of transistors comprises low-voltage transistors and the cross-coupled pair of transistors, the pair of isolation transistors, and the pair of cascode transistors comprise high-voltage transistors.

In at least one embodiment, a level shifter includes a first circuit having low-voltage transistors coupled between a pair of complementary nodes and a first ground. The first circuit is responsive to an input signal and a complementary input signal generated in a first voltage domain. The level shifter includes a second circuit comprising high-voltage transistors coupled between the pair of complementary nodes and an output power supply node and configured to generate complementary signals on the pair of complementary nodes in a second voltage domain. In an embodiment, the level shifter includes an input buffer circuit comprising second low-voltage transistors coupled between an input power supply node and an input ground and configured to generate the complementary input signal based on the input signal generated in the first voltage domain. In an embodiment, the level shifter includes an output circuit comprising second high-voltage transistors coupled between the output power supply node and an output ground and responsive to a signal on a node of the pair of complementary nodes to generate an output signal in the second voltage domain.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

An aging resilient level shifter having improved aging performance includes high-voltage isolation transistors in a cascode configuration with high-voltage cascode transistors, which are in a cascode configuration with low-voltage input transistors, thereby reducing stress on the high-voltage cascode transistors coupled to the low-voltage input transistors. The aging resilient level shifter has an increased lifetime as compared to a conventional level shifter. An aging simulation indicates that the cascode transistors of the aging resilient level shifter have a negligible threshold voltage shift (e.g., a threshold voltage shift of less than 15 mV) as compared to a threshold voltage shift of over 500 mV of the cascode transistors in the conventional level shifter.

Figure 1:
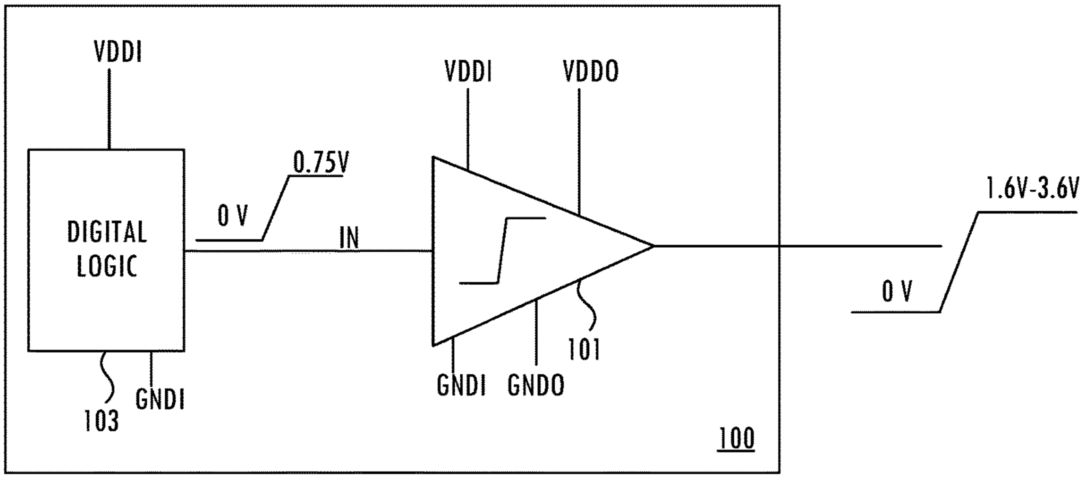
FIG. 1 (PRIOR ART)
FIG. 1 illustrates a circuit diagram of an integrated circuit system including a level shifter circuit.

Referring to FIG. 1, a conventional level shifter shifts signal voltages from a low voltage domain to signal voltages in a high voltage domain. For example, digital logic 103 operates in a first voltage domain, which includes input power supply node VDDI and input ground GNDI with signal swings between 0 V and an input power supply voltage level in the range of 0.75 V to 0.90 V. Level shifter 101 receives digital signal IN from digital logic 103 in the low voltage domain and shifts the signal level to generate signal OUT in a second voltage domain, e.g., a high voltage domain for an interface to analog circuits (e.g., circuits for communicating externally from integrated circuit 100). In an embodiment, the second voltage domain includes output power supply node VDDO and output ground GNDO with signal swings between 0 V and an output power supply voltage level in the range of 1.6 V to 3.6 V.

Figure 2:
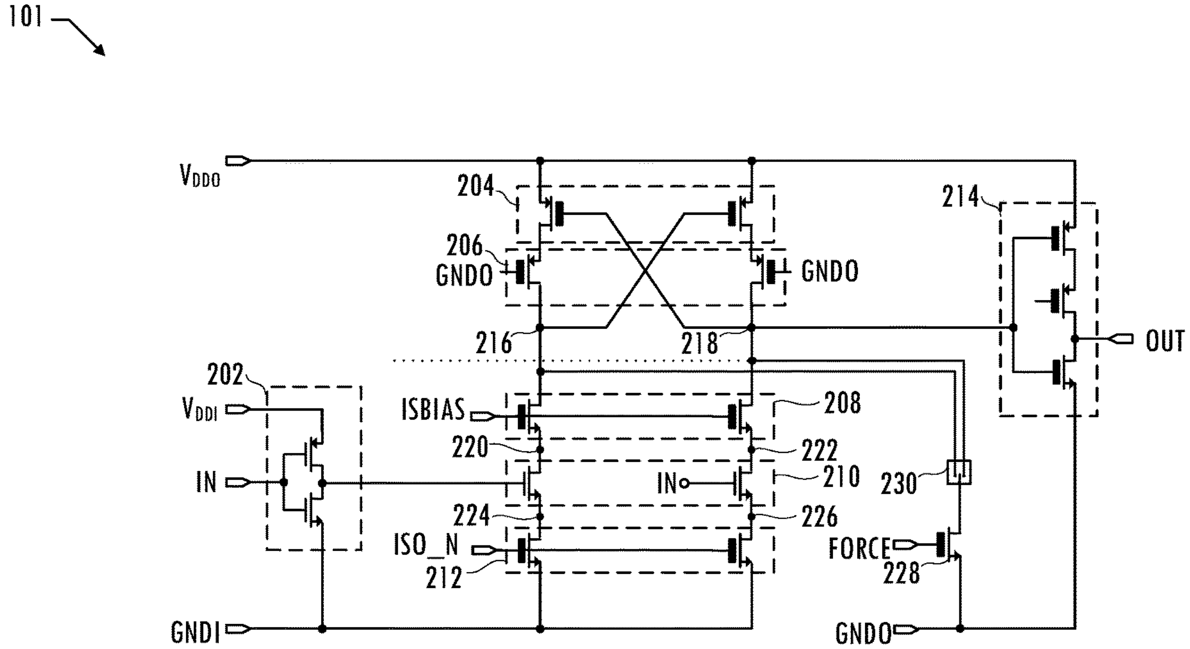
FIG. 2 (PRIOR ART)
FIG. 2 illustrates a circuit diagram of a conventional level shifter of an integrated circuit.

FIG. 2 illustrates a circuit diagram of a conventional low-to-high level shifter including input buffer 202, cross-coupled transistors 204, and output buffer 214. Input buffer 202 includes low-voltage transistors and output buffer 214 includes high-voltage transistors. An exemplary integrated circuit manufacturing process provides transistors having different breakdown voltages and speeds of operation as a result of gate terminals formed using oxide layers of different thicknesses. An exemplary high-voltage transistor has a thicker gate oxide and therefore has a higher breakdown voltage but is slower than a low-voltage transistor that has a thinner gate oxide thickness. High-voltage transistors are indicated in the figures by transistors having filled, rectangular gate terminals.

Cross-coupled transistors 204 are high-voltage p-channel metal oxide semiconductor field effect transistors (MOSFETs) (i.e., high-voltage PMOS transistors) having source terminals coupled to output power supply node VDDO and drain terminals coupled to corresponding PMOS transistors of cascode transistors 206, which are also high-voltage PMOS transistors and have gate terminals coupled to output ground GNDO (i.e., cascode transistors 206 are on). In general, cascode configuration refers to a series coupling of a common-source transistor (e.g., transistors 204), which has high impedance node, to a common gate transistor, i.e., a cascode transistor (e.g., cascode transistors 206), to increase output impedance. Since there is no direct coupling from output to input, a cascode configuration improves input-to-output isolation, reduces the Miller effect, and increases bandwidth of the common source configuration.

Nodes 216 and 218, which are coupled to respective gate terminals of cross-coupled transistors 204 and respective drain terminals of cascode transistors 206, are also coupled to respective drain terminals of cascode transistors 208, which are high-voltage n-channel MOSFETs (i.e., high-voltage NMOS transistors) and have gate terminals coupled to bias signal ISBIAS. In at least one embodiment, bias signal ISBIAS has a voltage level in the range of 1.25 V to 1.45 V when the temperature is greater than 25 C. and has a voltage level in the range of 1.35 V to 1.55 V when the temperature is less than 25 C. Corresponding source terminals of cascode transistors 208 are coupled to nodes 220 and 222 and drain terminals of pulldown transistors 210, which are low-voltage NMOS transistors. Corresponding source terminals of pulldown transistors 210 are coupled to nodes 224 and 226 and corresponding drain terminals of isolation transistors 212, which are high-voltage NMOS transistors that are controlled by control signal ISO_N and have source terminals coupled to input ground GNDI. In at least one embodiment, control signal ISO_N is generated by a buffer, which is powered by the same power supply as output power supply node VDDO. When control signal ISO_N='1', then it will equal VDDO.

In at least one embodiment of level shifter 101, the low voltage domain may be disabled, but the high voltage domain is enabled. Isolation transistors 212 isolate the input from the output when the input is undefined (e.g., when the low voltage domain is disabled and control signal ISO_N='0'). When the cross-coupled branches float (i.e., are undefined) isolation transistors 212 are off and control signal FORCE is configured to enable transistor 228 to force node 216 and node 218 to predetermined states (i.e., '1' and '0,' respectively, or '0' and '1,' respectively) via switch 230 according to a predetermined value of a read-only memory, fuse, or other selection technique. In general, isolation transistors 212 are positioned to be directly connected to a power supply node (e.g., at the bottom of the cross-coupled branches) to reduce the likelihood of impedance changes from affecting the rest of level shifter 101 and influencing performance. In another embodiment, switch 230 is omitted, transistor 228 of level shifter 101 is coupled to node 216, and control signal FORCE is configured to enable transistor 228 to force node 216 and node 218 to '0' and '1,' respectively. In yet another embodiment, switch 230 is omitted, transistor 228 of level shifter 101 is coupled to node 218, and control signal FORCE is configured to enable transistor 228 to force node 216 and node 218 to '1' and '0,' respectively.

Changing the state of cross-coupled transistors 204 requires a strong low-voltage transistor. When level shifter 101 is simulated under extreme operating conditions, e.g., VDDO=3.8 V, temperature of −40 C., and input signal IN toggling at a frequency of higher than 1 MHz, cascode transistors 208 suffer significant deterioration due to the hot carrier injection aging effect and level shifter 101 malfunctions before one year of operation. The increase in threshold voltage of cascode transistors 208 reduces the headroom of pulldown transistors 210, making pulldown transistors 210 too weak to toggle cross-coupled transistors 204. Thus, cascode transistors 208 are considered past their useful lifetime. An aging simulation of level shifter 101 predicts a threshold voltage shift of greater than 500 mV in cascode transistors 208 after ten years.

An instantiation of level shifter 101 is typically used for each control signal that is provided to analog circuitry in an integrated circuit device. If aging causes those level shifters to fail, then the integrated circuit device is no longer functional. A technique for reducing effects of aging on a level shifter includes reducing stress on cascode transistors 208 coupled to bias signal ISBIAS while maintaining suitable voltage headroom for pulldown transistors 210.

Figure 3:
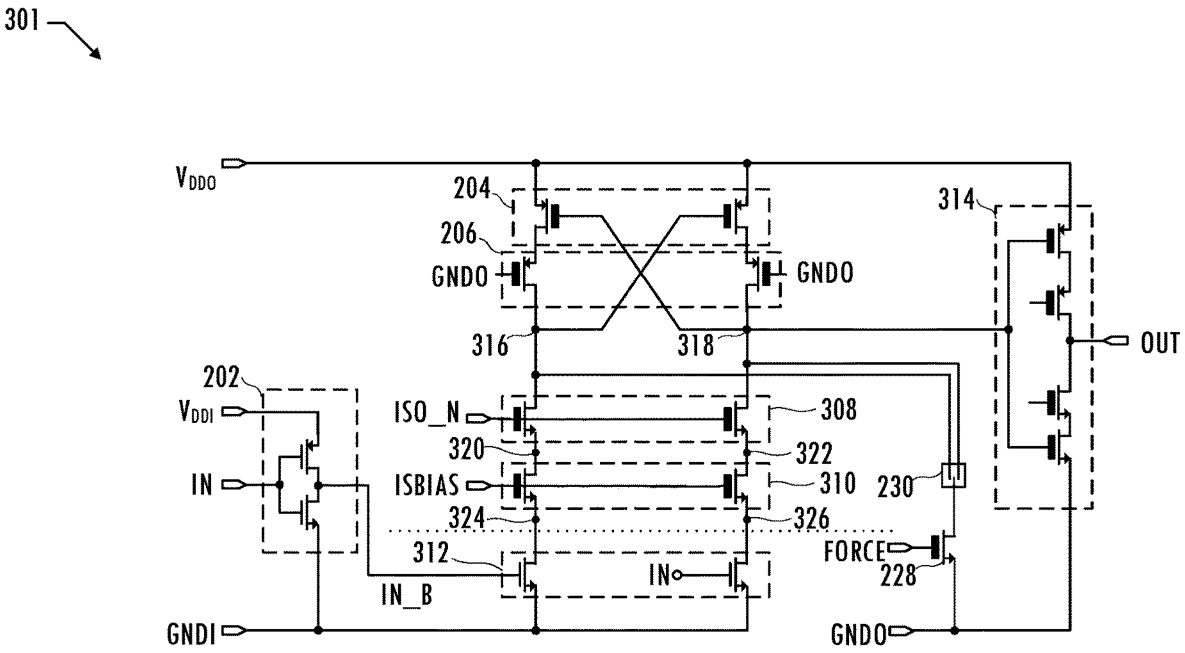
FIG. 3 illustrates a circuit diagram of an exemplary aging resilient level shifter of an integrated circuit consistent with at least one embodiment of the invention.

Referring to FIG. 3, in at least one embodiment, aging resilient level shifter 301 includes input buffer 202, cross-coupled transistors 204, and output buffer 314. Input buffer 202 includes low-voltage transistors and output buffer 314 includes high-voltage transistors. Cross-coupled transistors 204 are high-voltage PMOS transistors having source terminals coupled to output power supply node VDDO and having drain terminals coupled to corresponding PMOS transistors of cascode transistors 206, which are also high-voltage PMOS transistors and have gate terminals coupled to output ground GNDO. Nodes 316 and 318, which are coupled to respective gate terminals of cross coupled transistors 204 and respective drain terminals of cascode transistors 206, are also coupled to respective drain terminals of isolation transistors 308, which are high-voltage NMOS transistors, have gate terminals controlled by control signal ISO_N, and have corresponding source terminals coupled to cascode transistors 310, which are controlled by bias signal ISBIAS. In at least one embodiment, bias signal ISBIAS has a voltage level in the range of 1.25 V to 1.45 V when the temperature is greater than 25 C. and has a voltage level in the range of 1.35 V to 1.55 V when the temperature is less than 25 C. Corresponding source terminals of cascode transistors 310 are coupled to nodes 324 and 326 and respective drain terminals of pulldown transistors 312, which are low-voltage NMOS transistors. Source terminals of pulldown transistors 312 are coupled to input ground GNDI.

In at least one embodiment of level shifter 301, the low voltage domain may be disabled, but the high voltage domain is enabled. Isolation transistors 308 isolate the input from the output when the input is undefined (e.g., when the low voltage domain is disabled and control signal ISO_N='0'). When the cross-coupled branches float (i.e., are undefined) isolation transistors 308 are off and control signal FORCE is configured to enable transistor 228 to force node 316 and node 318 to predetermined states (i.e., '1' and '0,' respectively, or '0' and '1,' respectively) via switch 230 according to a predetermined value of a read-only memory, fuse, or other selection technique. Isolation transistors 308 are not directly connected to a power supply node, which generally increases the likelihood that impedance changes caused by the bulk effect of isolation transistors 308 affects the rest of the level shifter circuit and under some circumstances may degrade performance. However, when control signal ISO_N='1,' ISO_N will equal the voltage on output power supply node VDDO, which is greater than the shifted threshold voltage and isolation transistors 308 will be fully turned on. Isolation transistors 308 are in a cascode configuration with cascode transistors 310 thereby reducing the stress on cascode transistors 310 (e.g., limits the gate-to-source voltage of cascode transistors 310 to a voltage level no greater than 0.7 V). Although isolation transistors 308 are exposed to aging, when control signal ISO_N='1', stress from hot carrier injection is worse for large drain-to-source voltages, in general. Although isolation transistors 308 may have 3.8V at the drain terminal, their source terminals are limited by ISO_N-VGs_308. Since a buffer that is powered by the voltage on output power supply node VDDO (e.g., VDDO=3.8V) generates control signal ISO_N, their source voltage will be one threshold voltage lower than the voltage on the gate terminal. Hence, the drain-to-source voltages of isolation transistors 308 are limited to 0.8-0.9 V. Accordingly, isolation transistors 308 do not experience substantial stress from hot carrier injection. Simulation of level shifter 301 operating under extreme conditions (e.g., VDDO=3.8 V, temperature of −40 C., and input signal IN toggling at a frequency of higher than 1 MHz), cascode transistors 310 have a threshold voltage shift of less than 15 mV after ten years and have a predicted lifetime of greater than 100 years.

Thus, aging resilient level shifting techniques have been described. The description of the invention set forth herein is illustrative and is not intended to limit the scope of the invention as set forth in the following claims. The terms "first," "second," "third," and so forth, as used in the claims, unless otherwise clear by context, are to distinguish between different items in the claims and do not otherwise indicate or imply any order in time, location or quality. For example, "a first received signal" and "a second received signal" do not indicate or imply that the first received signal occurs in time before the second received signal. Variations and modifications of the embodiments disclosed herein may be made based on the description set forth herein, without departing from the scope of the invention as set forth in the following claims.

What is claimed is:

1. A method for level-shifting an input signal from a first voltage domain to an output signal of a second voltage domain, the method comprising:

controlling a cross-coupled pair of transistors according to the input signal and a complementary input signal to generate a signal on a pair of complementary nodes, the cross-coupled pair of transistors having a first doping type and the controlling using a pair of transistors having a second doping type, the second doping type being complementary to the first doping type;

isolating the pair of transistors from the pair of complementary nodes using a pair of isolation transistors and a pair of cascode transistors, the pair of isolation transistors and the pair of cascode transistors being coupled between the pair of transistors and the pair of complementary nodes; and biasing the pair of cascode transistors using a predetermined bias voltage, wherein the pair of isolation transistors is selectively disabled by an isolation control signal, wherein the first voltage domain has an input power supply voltage level above an input ground and the second voltage domain has an output power supply voltage level above an output ground, the output power supply voltage level being greater than the input power supply voltage level, and wherein the predetermined bias voltage is less than the output power supply voltage level and the predetermined bias voltage is greater than the input power supply voltage level.

2. The method as recited in claim 1 wherein the pair of transistors comprises low-voltage transistors, and wherein the cross-coupled pair of transistors, the pair of isolation transistors, and the pair of cascode transistors comprise high-voltage transistors.

3. The method as recited in claim 1 wherein the pair of transistors are in the first voltage domain, and wherein the cross-coupled pair of transistors, the pair of cascode transistors, and the pair of isolation transistors are in the second voltage domain.

4. The method as recited in claim 1 wherein the pair of isolation transistors reduce stress on the pair of cascode transistors.

5. The method as recited in claim 1 further comprising:

receiving the input signal in the first voltage domain; and generating the complementary input signal based on the input signal in the first voltage domain, wherein the input signal and the complementary input signal have a first voltage swing between the input power supply voltage level and the input ground.

6. The method as recited in claim 5 further comprising:

buffering the signal on the pair of complementary nodes in the second voltage domain to generate the output signal, wherein the output signal has a second voltage swing between the output power supply voltage level and the output ground, wherein the receiving and generating uses low-voltage transistors, and wherein the buffering uses high-voltage transistors.

7. The method as recited in claim 1 wherein the pair of isolation transistors is configured as a second pair of cascode transistors with respect to the pair of cascode transistors, thereby reducing stress on the pair of cascode transistors.

8. The method as recited in claim 1 wherein the isolation control signal is coupled to gate nodes of the pair of isolation transistors and the method further comprises:

using the isolation control signal to disable the pair of isolation transistors; and while the pair of isolation transistors is disabled, forcing the pair of complementary nodes to a predetermined state in response to a second control signal.

9. A level shifter comprising:

a cross-coupled pair of transistors coupled between a first power supply node and a first pair of nodes, the cross-coupled pair of transistors having a first doping type;

a pair of isolation transistors coupled between the first pair of nodes and a second pair of nodes, the pair of isolation transistors having a second doping type, the second doping type being complementary to the first doping type, wherein the pair of isolation transistors is selectively disabled by an isolation control signal;

a pair of cascode transistors coupled between the second pair of nodes and a third pair of nodes, the pair of cascode transistors having the second doping type and being configured to receive a predetermined bias voltage; and a pair of transistors coupled between the third pair of nodes and a second power supply node, the pair of transistors having the second doping type, the pair of transistors being configured to receive an input signal and a complementary input signal, wherein the first power supply node is configured to receive an output power supply voltage level above an output ground and a third power supply node is configured to receive an input power supply voltage level above an input ground, the output power supply voltage level being greater than the input power supply voltage level, the second power supply node being coupled to the input ground, and wherein the predetermined bias voltage is less than the output power supply voltage level and the predetermined bias voltage is greater than the input power supply voltage level.

10. The level shifter as recited in claim 9 further comprising:

an input circuit coupled between the second power supply node and the third power supply node and configured to generate the complementary input signal based on the input signal.

11. The level shifter as recited in claim 10 further comprising:

an output circuit coupled between the first power supply node and a fourth power supply node and configured to generate an output signal on an output node based on a signal on the first pair of nodes.

12. The level shifter as recited in claim 11 wherein the input circuit receives the input signal, the input signal having a first voltage swing between the input power supply voltage level on the third power supply node and the input ground on the second power supply node, wherein the output signal has a second voltage swing between the output power supply voltage level on the first power supply node and the output ground on the fourth power supply node, and wherein the input power supply voltage level is less than the output power supply voltage level.

13. The level shifter as recited in claim 11 wherein the pair of transistors and the input circuit comprise low-voltage transistors; and wherein the output circuit, the cross-coupled pair of transistors, the pair of isolation transistors, and the pair of cascode transistors comprise high-voltage transistors.

14. The level shifter as recited in claim 11 wherein the input circuit and the pair of transistors are in a first voltage domain, and wherein the cross-coupled pair of transistors, the pair of isolation transistors, the pair of cascode transistors, and the output circuit are in a second voltage domain.

15. The level shifter as recited in claim 9 wherein the pair of isolation transistors is configured as a second pair of cascode transistors with respect to the pair of cascode transistors, thereby reducing stress on the pair of cascode transistors.

16. A level shifter comprising:

a first circuit comprising low-voltage transistors, the first circuit being coupled between a pair of complementary nodes and a first ground, and the first circuit being responsive to an input signal and a complementary input signal generated in a first voltage domain; and a second circuit comprising high-voltage transistors, the second circuit being coupled between the pair of complementary nodes and an output power supply node in a second voltage domain, wherein the second circuit further comprises:

a cross-coupled pair of transistors coupled between the output power supply node and a second pair of complementary nodes, the cross-coupled pair of transistors having a first doping type;

a pair of isolation transistors coupled between the second pair of complementary nodes and the pair of complementary nodes, the pair of isolation transistors having a second doping type and being selectively disabled by an isolation control signal; and a pair of cascode transistors coupled between the second pair of complementary nodes and the first ground, the pair of cascode transistors being configured to receive a predetermined bias voltage, wherein the predetermined bias voltage is less than an output power supply voltage on the output power supply node and the predetermined bias voltage is greater than an input power supply voltage level.

17. The level shifter as recited in claim 16 further comprising:

an input buffer circuit comprising second low-voltage transistors coupled between an input power supply node and the first ground and configured to generate the complementary input signal based on the input signal generated in the first voltage domain; and an output circuit comprising second high-voltage transistors coupled between the output power supply node and an output ground and responsive to a signal on a node of the second pair of complementary nodes to generate an output signal in the second voltage domain.

18. The level shifter as recited in claim 16 wherein the second circuit further comprises:

a second pair of cascode transistors coupled between a third pair of complementary nodes and the second pair of complementary nodes, the second pair of cascode transistors having the first doping type.

19. The level shifter as recited in claim 16 wherein the pair of isolation transistors is configured as a third pair of cascode transistors with respect to the pair of cascode transistors, thereby reducing stress on the pair of cascode transistors.

* * * * *